United States Patent [19]

Sindledecker

[11] Patent Number: 5,008,705
[45] Date of Patent: Apr. 16, 1991

[54] AUTOFOCUS SYSTEM FOR MICROLITHOGRAPHY

[75] Inventor: Glenn L. Sindledecker, Lexington, Mass.

[73] Assignee: General Signal Corporation, Stamford, Conn.

[21] Appl. No.: 513,783

[22] Filed: Apr. 23, 1990

[51] Int. Cl.$^5$ .............................................. G03B 27/52
[52] U.S. Cl. ........................................ 355/43; 355/53; 355/60; 250/548
[58] Field of Search ................... 355/43, 53, 60, 66; 250/548, 557; 356/401

[56] References Cited

U.S. PATENT DOCUMENTS 4,363,962 12/1982 Shida ............................... 250/548 X
4,650,983 3/1987 Suwa ............................... 250/548 X

*Primary Examiner*—L. T. Hix
*Assistant Examiner*—Khanh Dang
*Attorney, Agent, or Firm*—Henry D. Pahl, Jr.

[57] ABSTRACT

The autofocus system disclosed herein utilizes grazing angle illumination of a spot on the surface of a semiconductor wafer approximately on the axis of the projection lens so that the position of the spot varies as a function of the spacing between the lens and the wafer. The spot is viewed, also at grazing angle, by an optical system which projects an image of the spot towards a set of detectors. The beam is split and the split beams are directed against oppositely facing reflective surfaces on an angularly oscillatable mirror. After reflection from the mirror, the respective split beams are detected so as to generate respective pulse signals corresponding to the passing of the respective spot image past a predetermined position. The relative timing or phasing of the two pulse signals is variable as a function of the relative positions of the lens and wafer but is relatively insensitive to small displacements of the mirror and the timing relationship is employed in a servo loop for adjusting the relative positions of the lens and the wafer.

6 Claims, 2 Drawing Sheets

AUTOFOCUS SYSTEM FOR MICROLITHOGRAPHY

BACKGROUND OF THE INVENTION

The present invention relates to microlithographic systems for manufacturing integrated circuits and more particularly to an autofocus system for relatively positioning a projection lens and a semiconductor wafer which is to be exposed through the lens.

The manufacture of integrated circuits requires the forming of very finely detailed images on the surface of a semiconductor wafer coated with a suitable resist. For the production of high density integrated circuits, the image is typically formed by projection optics providing a five to one or ten to one reduction ratio. As is understood, the depth of field for such projection optics is relatively small and it is important to maintain a precise positioning between the projection lens and the wafer. Various autofocus systems have been proposed for maintaining or controlling this spacing.

The most popular autofocus systems employ the illumination, at a shallow angle or so-called grazing incidence, of a spot on the surface of the wafer so that the position of the spot is a function of the spacing between the lens and the wafer. The spot is then viewed from a similar shallow angle by optics which project an image of the spot towards detectors which utilize the relative position of the image in a servo system to control the spacing between the projection lens and the wafer. Rather than sensing relative light amplitudes, e.g. between a pair of photodetectors which the spot image straddles, the detector optics typically employ a angularly oscillatable mirror to scan the projected image so that displacements are converted to timing changes. One source of error, however, has been caused by small shifts or translations in the mirror position, e.g. such as those caused by bearing wear or differential temperature changes.

Among the several objects of the present invention may be noted the provision of apparatus for automatically controlling the relative position of a projection lens and a semiconductor wafer which is to be exposed through the lens; the provision of such a system which employs illumination, at a shallow angle, of a spot on the surface of the wafer; the provision of such a system which utilizes scanning of a projected image of the illuminated spot; the provision of such a system which is relatively insensitive to displacements of a mirror employed for scanning the spot image; the provision of such a system which is highly accurate; the provision of such a system which is highly reliable and which is of relatively simple and inexpensive construction. Other objects and features will be in part apparent and in part pointed out hereinafter.

SUMMARY OF THE INVENTION

Briefly, the apparatus of the present invention operates to relatively position a projection lens and a semiconductor wafer which is to be exposed through the lens. A spot on the surface of the wafer, approximately on the lens axis, is illuminated at a shallow angle so that the position of the spot is a function of the spacing between the lens and the wafer. Lens means are employed for viewing the spot at a similar shallow angle and projecting an image of the spot as a beam of light along a preselected path. Along the path, a beam splitter divides the beam and means are incorporated for directing the split beams at respective ones of a pair of oppositely facing reflective surfaces on an angularly oscillatable mirror. Respective means for detecting each of the split beams after reflection from the mirror generate respective pulse signals corresponding to the passing of each spot image past a predetermined position. Servo means responsive to the relative timing of the two pulse signals then adjusts the relative positions of the lens and the wafer.

BRIEF DESCRIPTION OF THE DRAWINGS

Corresponding reference characters indicate corresponding parts throughout the several views of the drawings.

DESCRIPTION OF THE PREFERRED EMBODIMENT

Figure 1:
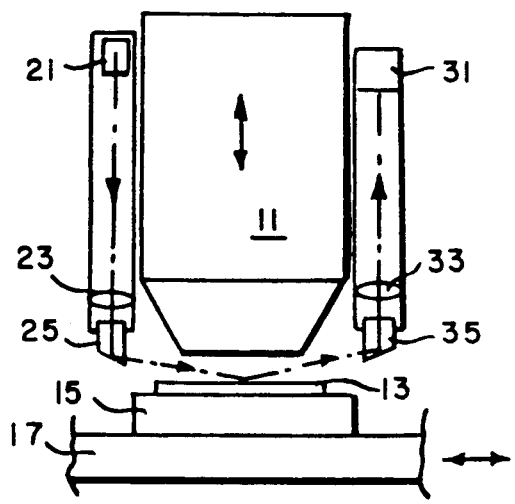
FIG. 1 is a diagrammatic illustration showing the general arrangement of a grazing angle autofocus system of the type to which the present invention is applicable.

Referring now to FIG. 1, an image reducing projection lens suitable for integrated circuit microlithography is indicated generally by reference character 11 and a semiconductor wafer which is to be exposed through the lens is designated by reference character 13. The lens 11 is vertically movable to implement focusing though it should be understood that movement of the wafer might also be utilized.

As is conventional, wafer 13 is held in a chuck 15 which is in turn carried on an X-Y stage 17 so that different portions of the wafer may be brought into alignment with the projection lens for exposure. This is generally referred to as a step and repeat mode of operation.

Mounted on the left side of the projection lens 11, as illustrated, is an optical system for illuminating, at shallow angle or grazing incidence, a spot on the surface of the wafer, the spot being roughly on the axis of the projection lens. The illuminating optics are illustrated in simplified form as comprising a light source 21, imaging lenses 23, and a prism 25 which directs the beam inwardly under the projection lens 11 so as to approach the surface of the wafer 13 at essentially grazing incidence. Preferably the light is broadband, e.g. from an incandescent source, but is filtered so as to be non-exposing to the resist on the wafer.

As indicated, the illuminating optics are mounted on or with the projection lens 11 and thus move vertically with the lens in adjusting focus. Accordingly, while the illuminated spot is approximately on the axis of the projection lens, its actual position will vary from left to right, as viewed in FIG. 1, as a function of the spacing between the lens 11 and the wafer 13.

Mounted on the right side of the projection lens 11 is a similar set of optics for viewing the illuminated spot on the surface of the wafer, with the detection optics 31 being substituted in place of the light source 21.

Figure 2A:
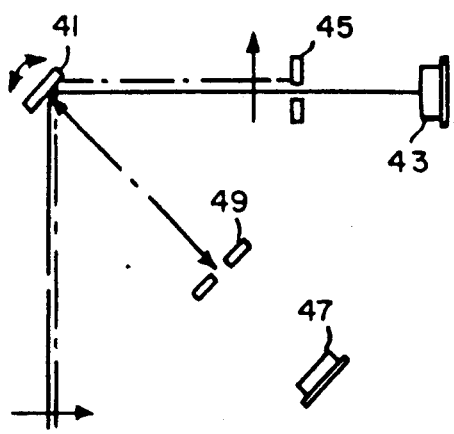
FIG. 2A shows detection optics of a type heretofore employed in an autofocus system of a type illustrated in FIG. 1, illustrating the effect of changing spacing between the projection lens and a wafer which is to be exposed through the lens.

Referring now to the prior art detection optics illustrated in FIG. 2A, an angularly oscillatable mirror is designated generally by reference character 41. The mirror is oscillated by a suitable galvanometer drive (not shown). The nominal or rest position of mirror 41 is essentially at 45 degrees to the vertical so that the upwardly incoming beam is deflected approximately 90 degrees towards a detector 43 provided with a slit reticle 45 corresponding to the shape of the light source. A timing reference signal is generated by means of a combined source/detector unit 47 which is located on a line essentially normal to the reflecting surface of the mirror at its center or rest position. The unit 47 illuminates a slit 49 and also detects light reflected back from the mirror 41 to the slit so that a reference pulse signal is generated as the mirror passes through its center or rest position during its oscillations. In the prior art systems, a servo system controls the relative positioning of the lens 11 and the wafer 13 as a function of the phasing of the pulse signal from the detector 43 relative to the timing reference signal obtained from the source/detector unit 47.

Figure 2B:
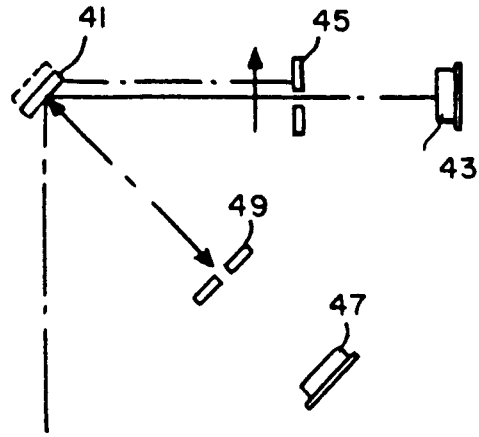
FIG. 2B is an illustration similar to FIG. 2A showing the effect of small displacements of a scanning mirror employed in the system.

As indicated by the dotted line beam path in FIG. 2A, an increase in the spacing between the projection lens and the wafer 13 will cause the beam path to displace to the right as it comes in and to be displaced upwardly as it leaves the mirror 41. As is understood, this will result in a shift in the timing of the pulse signal obtained from the detector 43 relative to the reference pulse signal obtained from the source/detector 47. As indicated, this shift in timing is typically employed to generate a feedback signal which controls the positioning of the projection lens 11. However, as illustrated in FIG. 2B, a displacement of the mirror 41 can cause a similar shift in the reflected beam and consequent alteration of the pulse timing, even though there has been no change in the lens/wafer spacing. For example, as illustrated, a shift in the nominal position of the mirror to the left and up can cause a displacement upwardly of the exiting beam even though there has been no change in the projection lens/wafer spacing. This upwardly shift will cause a corresponding shift in the timing of the pulse signal obtained from the detector 43 but will not cause any change in the reference timing signal. Accordingly, an error will be introduced into the focussing.

Figure 3A:
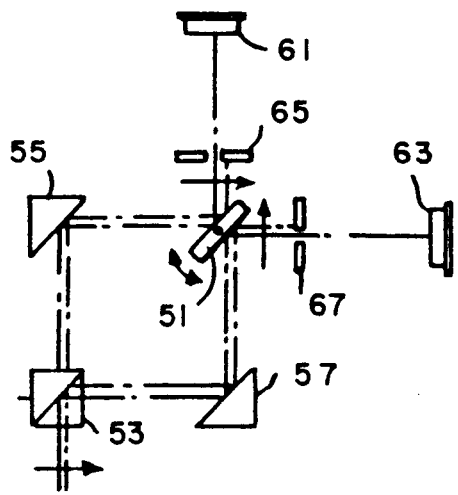
FIG. 3A is a diagram illustrating detection optics in accordance with the present invention and showing the effect of changing spacing between the projection lens and a wafer.

Rather than generating a reference timing pulse, the detection optics of the present invention effects a splitting of the incoming beam with each portion of the split beam being scanned by a respective side of a double-faced oscillating mirror. Referring now to FIG. 3A, an angularly oscillatable mirror having oppositely facing reflective surfaces is indicated generally by reference character 51. The incoming beam is split by a beam splitter cube 53 so that essentially half of the incident energy passes straight through and half is turned 90 degrees. The continuing and diverted portions are redirected, by respective mirrors 55 and 57, towards respective reflecting surfaces of the oscillating mirror 51. The reflecting surfaces in turn direct the respective beam components toward respective detectors 61 and 63, each detector being provided with a slit reticle, as indicated by reference characters 65 and 67.

As illustrated by the broken lines in FIG. 3A, an increase in the spacing between the projection lens 11 and the wafer 13 which causes a shift in the incoming beam to the right. This shift in the incoming beam correspondingly causes a shift to the right of the beam which is directed towards the detector 61 and a shift upwardly of the beam which is directed towards the detector 63. Assuming that the mirror 51 is rotating to the right, the corresponding pulse out of the detector 61 will be advanced in time whereas the pulse out of the detector 63 will be delayed in time. Assuming a feedback signal is generated as a function of the difference in phase between the two pulse signals, it can be seen that the changes will be additive.

Figure 3B:
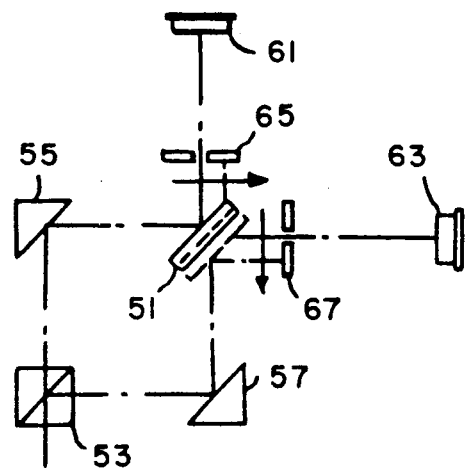
FIG. 3B is a drawing similar to FIG. 3A showing the effect of a small displacement of a doubly faced scanning mirror employed in the system.

On the other hand, if there is a small translation of the mirror, e.g. to the right and downwardly as illustrated in FIG. 3B, the beam going to the detector 61 will be shifted to the right while the portion of the beam headed towards the detector 63 will be shifted downwardly. These shifts will produce similar rather than opposite shifts in the pulse phasing from the detectors 61 and 63 so that these changes will tend to counteract rather than aid each other in generating a feedback signal based upon phase difference.

Figure 4:
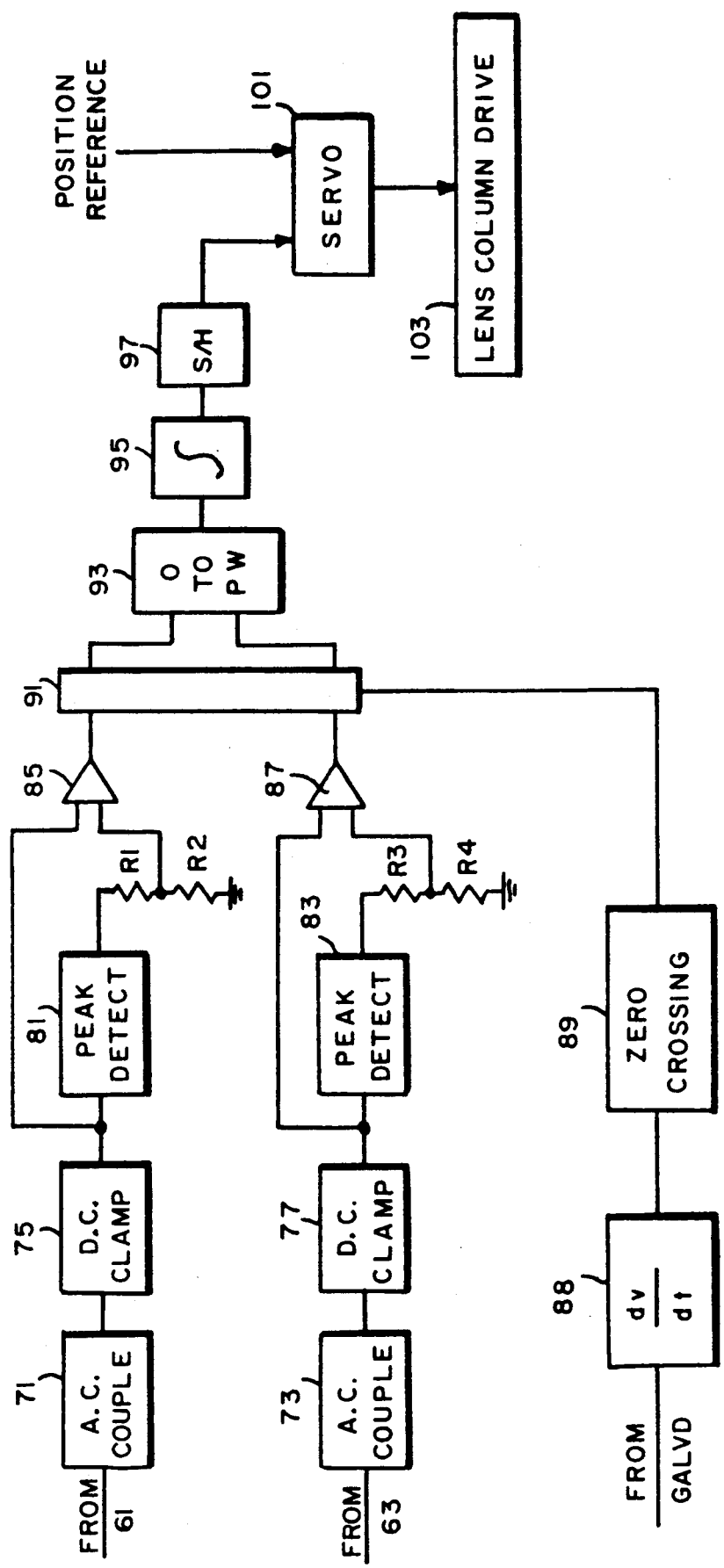
FIG. 4 is a block diagram illustrating a servo system which is responsive to signals generated by the detection optics of FIG. 3A for adjusting the relative positions of a projection lens and wafer.

FIG. 4 illustrates, generally, circuitry appropriate for utilizing the pulse signals obtained from detectors 61 and 63 to generate a feedback signal useful in controlling the projection lens/wafer spacing. This circuitry is generally similar to that employed in the prior art except that the feedback signal is generated as a function of the difference in phase of two variable signals rather than as a difference in phase between one variable signal and a reference timing signal. To obtain precisely defined timing pulses, each of the signals from the detectors 61 and 63 is a.c. coupled, as indicated at 71 and 73 respectively, and then applied to d.c. clamp circuits, as indicated at 75 and 77 respectively, so as to counteract any d.c. drift. These stabilized signals are then applied to respective peak detectors 81 and 83. In each channel, a voltage equal to one half of the respective peak value is generated by respective divider resistors R1–R4 and is applied as one input to a respective comparator 85 and 87. The original stabilized incoming signal is applied as the other input to each comparator. Accordingly, each of the pulse signals will tend to trigger the comparator at fifty percent of its peak amplitude, thereby to yield well defined squarewave pulses.

As will be understood, the optical detectors 61 and 63 will generate pulses on both the clockwise and counterclockwise swings of the mirror 51. However, in the embodiment illustrated, only pulses generated during one direction of the swing are utilized. To block the pulses generating during the other half of the oscillation, a galvanometer position signal is applied to a differentiating circuit 88 and the differentiated signal is applied to a zero crossing detector 89. The output from the zero crossing detector is used to control gating circuitry, indicated at reference character 91 generally, which blocks the unwanted pulses.

The pulses passed through the gating circuitry 91 are applied to control a phase-to-pulse width converter 93 which is essentially a flipflop. The output from this circuit is essentially a squarewave whose duration is equal to the difference in the phases of the two detected pulses. To obtain a feedback signal, the pulse width modulated signal is integrated as indicated at 95 and the integrated signal is periodically sampled and held, as indicated at 97, to provide a steady level feedback signal A servo loop controller, indicated generally by reference character 101, compares the feedback signal with a position reference signal representing the desired spacing between the projection lens 11 and the wafer 13 and energizes the drive mechanics for the lens column, designated by references character 103, so as to bring the actual position of the lens to the desired position. Since the generation of the feedback signal is essentially insensitive to small displacements of the scanning mirror 51, the system can provide quite accurate relative positioning of the lens and wafer notwithstanding the utilization of an oscillating mirror in the optical sensing system.

In view of the foregoing it may be seen that several objects of the present invention are achieved and other advantageous results have been attained.

As various changes could be made in the above constructions without departing from the scope of the invention, it should be understood that all matter contained in the above description or shown in the accompanying drawings shall be interpreted as illustrative and not in a limiting sense.

What is claimed is:

1. In a microlithographic system, apparatus for relatively positioning a lens and an object which is to be exposed through the lens, said apparatus comprising:
   means for illuminating, at a shallow angle, a spot on the surface of the object which is approximately on the lens axis, the position of the spot being thereby a function of the spacing between the lens and the object;
   lens means for viewing said spot at a shallow angle and projecting a corresponding beam of light along a preselected path;
   along said path of projection, a beam splitter for dividing said beam;
   angularly oscillatable mirror means providing a pair of reflective surfaces in fixed relation to each other;
   means for directing the split beams at respective ones of said reflective surfaces;
   respective means for detecting each of the split beams after reflection from the respective reflective surfaces of said mirror means and generating respective pulse signals each corresponding to the passing of the respective spot image past a predetermined position; and
   servo means responsive to the relative timing of the two pulse signals for adjusting the relative positions of the lens and the object.

2. In a microlithographic system for the manufacture of integrated circuits, apparatus for relatively positioning a projection lens and a semiconductor wafer which is to be exposed through the lens, said apparatus comprising:
   means for illuminating, at a shallow angle, a spot on the surface of the wafer which is approximately on the lens axis, the position of the spot being thereby a function of the spacing between the lens and the wafer;
   lens means for viewing said spot at a shallow angle and projecting an image of said spot as a beam of light along a preselected path;
   along said path, a beam splitter for dividing said beam;
   an angularly oscillatable mirror having oppositely facing reflective surfaces in fixed relation to each other;
   means for directing the split beams at respective ones of said reflective surfaces;
   respective means for detecting each of the split beams after reflection from the respective reflective surfaces of said mirror and generating respective pulse signals each corresponding to the passing of the respective spot image past a predetermined position; an
   servo means responsive to the relative timing of the two pulse signals for adjusting the relative positions of the lens and the wafer.

3. Apparatus as set forth in claim 2 wherein said servo means includes means responsive to said pulse signals for generating a pulse width modulated signal having a pulse width which varies as a function of the relative phasing of said pulse signals.

4. Apparatus as set forth in claim 3 further comprising means for integrating said pulse width modulated signal.

5. Apparatus as set forth in claim 3 further comprising gating means responsive to the position of said mirror for blocking pulses generated by said detectors when said mirror is moving in one direction.

6. In a microlithographic system for the manufacture of integrated circuits, apparatus for relatively positioning a projection lens and a semiconductor wafer which is to be exposed through the lens, said apparatus comprising:
   means for illuminating, at a shallow angle, a spot on the surface of the wafer which is approximately on the lens axis, the position of the spot being thereby a function of the spacing between the lens and the wafer;
   lens means for viewing said spot at a shallow angle and projecting an image of said spot as a beam of light along a preselected path;
   along said path, a beam splitter for dividing said beam;
   a mirror having oppositely facing reflective surfaces in fixed relation to each other, said mirror being rotatable around an axis parallel to said reflective surfaces;
   galvanometer means of oscillating said mirror around its axis;
   means for directing the split beams at respective ones of said reflective surfaces, the split beams approaching the mirror at essentially right angles to each other;
   respective means for detecting each of the split beams after reflection from the respective reflective surfaces of said mirror and generating respective pulse signals each corresponding to the passing of the respective spot image past a predetermined position;
   means responsive to the motion of said mirror for blocking pulse signals generated by said detecting means during rotation of said mirror in one direction;
   means responsive to pulse signals generated by said detecting means during rotation of said mirror in the opposite direction for generating a pulse width modulated signal having a pulse width which varies as a function of the relative phasing of those pulse signals; and
   servo means responsive to said pulse width modulated signal for adjusting the relative positions of the lens and the wafer.

* * * * *